US007743301B2

(12) United States Patent  
Sawai (10) Patent No.: US 7,743,301 B2
(45) Date of Patent: Jun. 22, 2010

(54) SEMICONDUCTOR INTEGRATED CIRCUIT AND METHOD OF TESTING SAME (75) Inventor: Yasunori Sawai, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 307 days.

(21) Appl. No.: 11/439,946

(22) Filed: May 25, 2006

(65) Prior Publication Data

US 2006/0282731 A1 Dec. 14, 2006

(30) Foreign Application Priority Data

May 26, 2005 (JP) ............... 2005-153751

(51) Int. Cl.
G01R 31/28 (2006.01)
(52) U.S. Cl. .................... 714/732; 714/718; 714/5; 714/42; 714/724; 714/726; 714/731; 714/733; 714/734; 714/736; 714/742; 714/744; 365/201
(58) Field of Classification Search .................. None
See application file for complete search history.

(56) References Cited

U.S. PATENT DOCUMENTS

| 4,340,857 | A | * | 7/1982 | Fasang ............... 714/733 |
| 4,551,837 | A | * | 11/1985 | Goegelein et al. ........ 714/732 |
| 5,001,713 | A | * | 3/1991 | Whetsel ............... 714/727 |
| 5,103,450 | A | * | 4/1992 | Whetsel ............... 714/724 |
| 5,349,587 | A | * | 9/1994 | Nadeau-Dostie et al. .... 714/729 |
| 5,355,369 | A | * | 10/1994 | Greenberger et al. ....... 714/727 |
| 5,495,487 | A | * | 2/1996 | Whetsel, Jr. ............. 714/736 |
| 5,631,910 | A | * | 5/1997 | Nozuyama et al. ........ 714/724 |
| 5,640,509 | A | * | 6/1997 | Balmer et al. ........... 714/42 |
| 5,900,753 | A | * | 5/1999 | Cote et al. ............. 327/145 |
| 6,003,142 | A | * | 12/1999 | Mori .................... 714/30 |
| 6,223,312 | B1 | * | 4/2001 | Nozuyama ............... 714/724 |
| 6,438,048 | B1 | * | 8/2002 | Kumar ................. 365/201 |
| 6,442,722 | B1 | * | 8/2002 | Nadeau-Dostie et al. .... 714/731 |
| 6,658,611 | B1 | * | 12/2003 | Jun .................... 714/719 |
| 6,671,839 | B1 | * | 12/2003 | Cote et al. ............. 714/726 |
| 6,996,761 | B2 | * | 2/2006 | Whetsel ............... 714/736 |
| 7,013,416 | B2 | * | 3/2006 | Whetsel ............... 714/736 |
| 2001/0040829 | A1 | * | 11/2001 | Arimoto et al. ......... 365/189.02 |
| 2002/0087931 | A1 | * | 7/2002 | Jaber .................. 714/733 |
| 2003/0074616 | A1 | * | 4/2003 | Dorsey ................. 714/733 |

(Continued)

FOREIGN PATENT DOCUMENTS

JP 2000-137061 5/2000

OTHER PUBLICATIONS

"At-Speed Board Test Simplified Via Embeddable Data Trace/Compaction IC", Lee Whetsel, AutoTestCon '91, IEEE, Sep. 1991, pp. 307-315.*

Primary Examiner—John P Trimmings
(74) Attorney, Agent, or Firm—McGinn IP Law Group, PLLC (57) ABSTRACT A semiconductor integrated circuit includes an MISR (Multiple-Input Signature Register) for generating and storing compressed code based upon code from a ROM, and for reading out and outputting the compressed data that has been stored. The MISR has a clock change-over unit for changing over a clock in such a manner that the MISR is caused to operate at a high-speed clock when the compressed data is generated and stored, and at a low-speed clock when the stored compressed data is read out and output.

8 Claims, 7 Drawing Sheets

U.S. PATENT DOCUMENTS

| | | | | |
|---|---|---|---|---|
| 2004/0003329 A1* | 1/2004 | Cote et al. | ............... | 714/726 |
| 2006/0090105 A1* | 4/2006 | Woods | ................ | 714/718 |
| 2006/0242523 A1* | 10/2006 | Whetsel | ................ | 714/736 |

* cited by examiner

PRIOR ART

SEMICONDUCTOR INTEGRATED CIRCUIT AND METHOD OF TESTING SAME

FIELD OF THE INVENTION

This invention relates to a semiconductor integrated circuit that incorporates a circuit to be tested, and to a method of testing the same. More particularly, the invention relates to a semiconductor integrated circuit and test method that enable the cost of manufacture to be reduced.

BACKGROUND OF THE INVENTION

Figure 7:
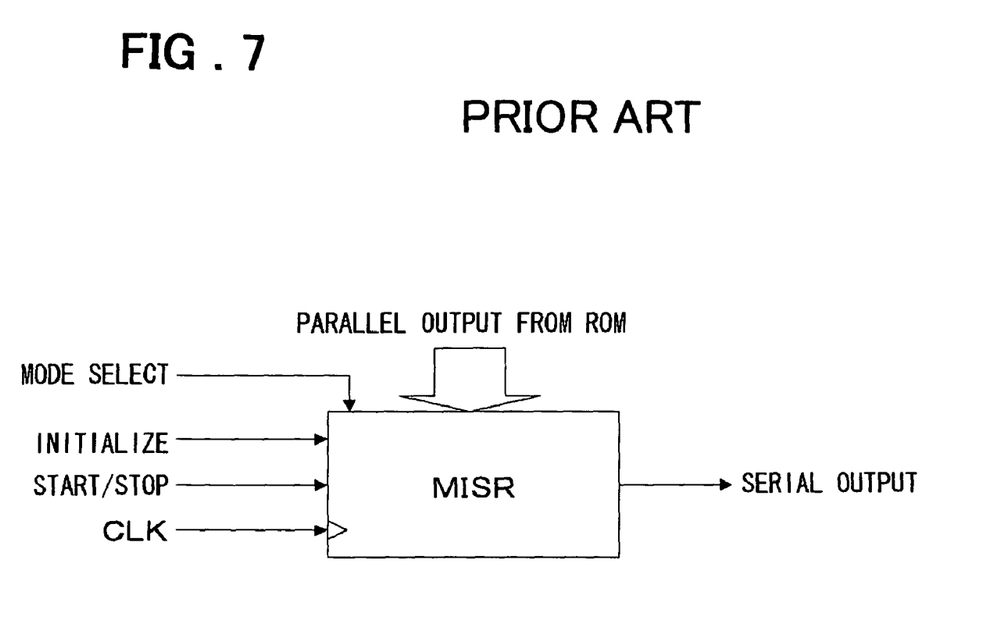
FIG. 7 is a block diagram schematically illustrating the structure of an MISR according to an example of the prior art.

A conventional example of a method of testing data (e.g., code) in a circuit under test [e.g., a ROM (Read-Only Memory), etc.] mounted on a semiconductor integrated circuit (e.g., a single-chip microcomputer) is as follows: On the basis of an address signal (one synchronized to a clock signal) that has been output in parallel from a CPU (Central Processing Unit) when a test mode (ROM dump test mode) is in effect, the code (synchronized to the clock signal) of the corresponding address is read out of the ROM in parallel, the code that has been read out is output (in parallel) to the exterior of the semiconductor integrated circuit, and the code that has been output is tested by an LSI (Large-Scale Integration) tester (not shown). Another method mounts a MISR (Multiple-Input Feedback Shift Register), which compresses and serially outputs the code that has been output from a ROM, on the semiconductor integrated circuit, and uses an LSI tester (not shown) to test the compressed code that has been serially output [see FIG. 7, e.g., FIG. 5(C) of Patent Document 1]. With this method, the code that has been output from the semiconductor integrated circuit is synchronized to the clock signal and compared with an expected value in the LSI tester, whereby the circuit is tested to determine whether the code is correct or not.

Since the speed of ROM read-out also is tested in the above-described method, the clock signal input to the semiconductor integrated circuit from the LSI tester has a frequency that is the maximum operating frequency of the ROM. Since the code that is output from the semiconductor integrated circuit to the LSI tester also is synchronized to this clock signal, it also has a frequency identical with the maximum operating frequency of the ROM. Also, in a case where a semiconductor integrated circuit having a mounted MISR is tested, the clock signal (CLK) supplied to the MISR is a single-channel signal. If code compression and serial output are performed by the MISR based upon a single-channel high-frequency clock signal, then the compressed data signal that is output from the MISR also will be a high-speed signal.

[Patent Document 1]
Japanese Patent Kokai Publication No. JP-P2000-137061A [FIG. 5(C)]

SUMMARY OF THE DISCLOSURE

In the method described above, it is required that the LSI tester be a high-speed LSI tester suited to the code output speed because of the high-speed code output from the semiconductor integrated circuit at the time of the test. In actuality, a high-speed LSI tester that is capable of supplying a high-frequency (e.g., 300 MHz) clock signal necessitates highly precise analysis and therefore is very high in cost.

Accordingly, there is much to be desired in the art. It is an object of the present invention to lower cost of manufacture while test reliability is maintained. Other objects will become apparent at the entire disclosure.

According to a first aspect of the present invention, there is provided a semiconductor integrated circuit that incorporates a circuit to be tested, the semiconductor integrated circuit comprising a clock signal change-over unit for changing over a clock signal in such a manner that a data storage unit is caused to operate based upon a first clock signal when data from the circuit to be tested is stored, and based upon a second clock signal, which has a frequency lower than that of the first clock signal, when the stored data is read out and output to the exterior after input of a clock change-over signal. Particularly, there is provided a semiconductor integrated circuit comprising;

a circuit to be tested that outputs data in sync with a first clock signal; and a data storage unit that compresses data output from the circuit to be tested in sync with the first clock signal, stores the compressed data, and outputs the stored data in sync with a second clock signal;

wherein the second clock signal has a frequency lower than that of the first clock signal.

The data storage unit in the semiconductor integrated circuit of the present invention preferably stores compressed data, which is the result of compressing the above-mentioned data, when it stores data, and reads out this stored compressed data when the data is read out.

The semiconductor integrated circuit of the present invention further comprises: a clock generator for generating the first clock; a central processor for outputting an address signal in sync with the first clock signal; and a circuit under test for storing data on a per-address basis and reading out data at a corresponding address in sync with the first clock signal by inputting the address signal; wherein the data storage unit includes a compressed data generating section for generating compressed data obtained by compressing the data; a storage section for storing the compressed data; a read-out section for reading the compressed data out of the storage section; and a controller for exercising control based upon the clock signal from the clock signal change-over unit so as to supply the first clock signal to the compressed data generating section and storage section from start to end of read-out of the data from the circuit under test, and supply the second clock signal, the frequency of which is lower than that of the first clock signal, to the storage section and read-out section from start to end of read-out of the compressed data from the storage section.

According to a second aspect of the present invention, there is provided a method of testing a semiconductor integrated circuit, comprising the steps of: operating based upon a first clock signal when data from a circuit under test is stored; and operating based upon a second clock signal, which has a frequency lower than that of the first clock signal, when the stored data is read out and output. Particularly, there is provided a method for testing a semiconductor integrated circuit comprising;

a first step of reading out data from a circuit to be tested in sync with a first clock signal;

a second step of compressing data read-out at the first step;

a third step of storing the compressed data compressed at the second step;

a fourth step of outputting the stored data stored at the third step in sync with a second clock signal having a lower frequency than that of the first clock signal.

The meritorious effects of the present invention are summarized as follows.

In accordance with the present invention, a test is feasible using a low-speed LSI tester. The reason is that in an actual test, the read-out of data from the circuit under test can be performed at a high speed using the first clock, and the comparison of the output compressed data with an expected value can be performed at low speed using the second clock signal whose frequency is lower than that of the first clock signal. Further, it is no longer necessary to mount a costly high-speed input/output buffer of complicated structure solely for the purpose of conducting a test. As a result, the cost of manufacture can be reduced while test reliability is maintained. Furthermore, since it is no longer necessary to mount a high-speed input/output buffer, the amount of current at testing time is reduced, the problem of input/output simultaneous switching noise (SSO) is solved and testing can be conducted stably.

Other features and advantages of the present invention will be apparent from the following description taken in conjunction with the accompanying drawings, in which like reference characters designate the same or similar parts throughout the figures thereof.

PREFERRED EMBODIMENTS OF THE INVENTION

Figure 1:
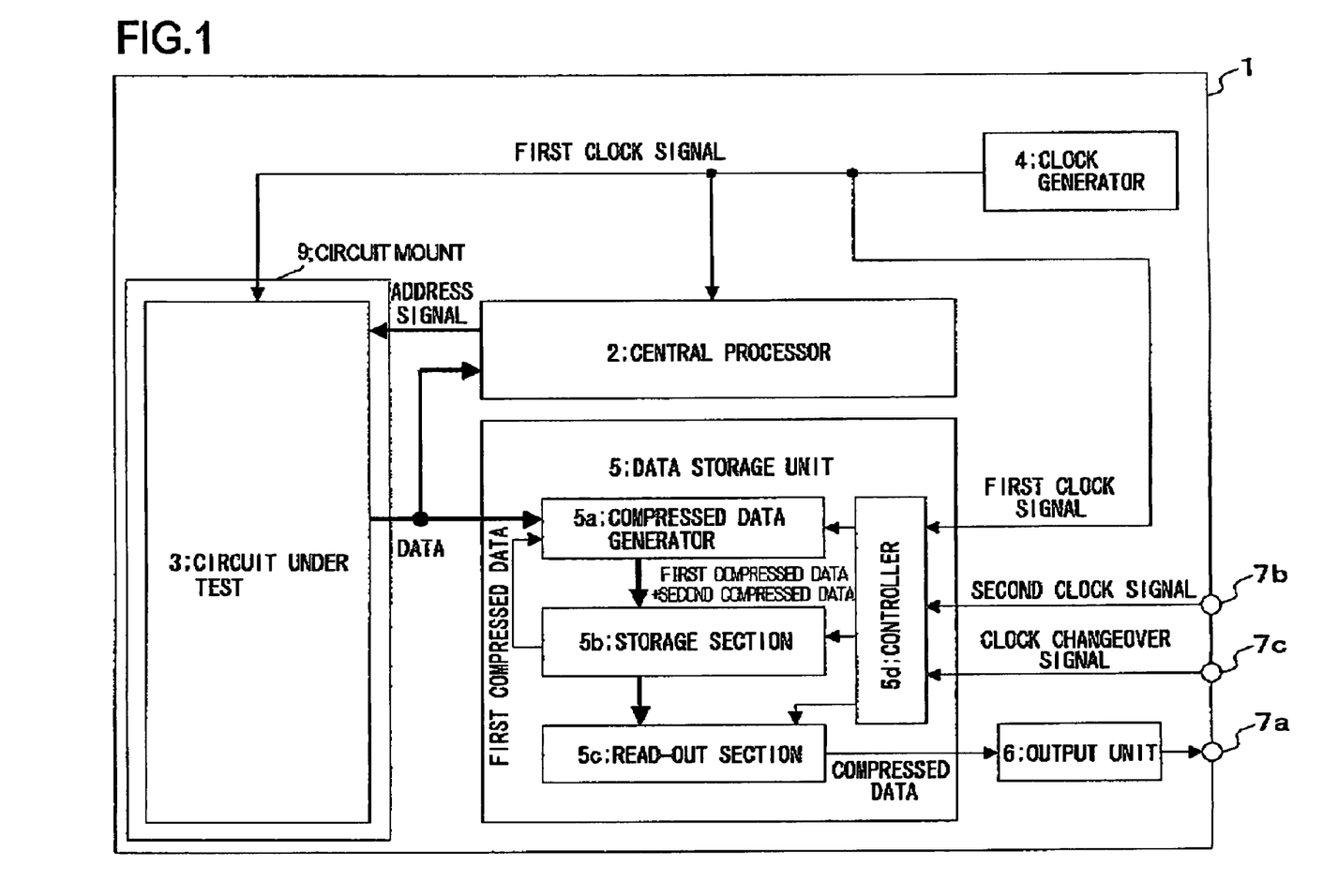
FIG. 1 is a block diagram schematically illustrating the structure of a semiconductor integrated circuit according to a first embodiment of the present invention.
Figure 2:
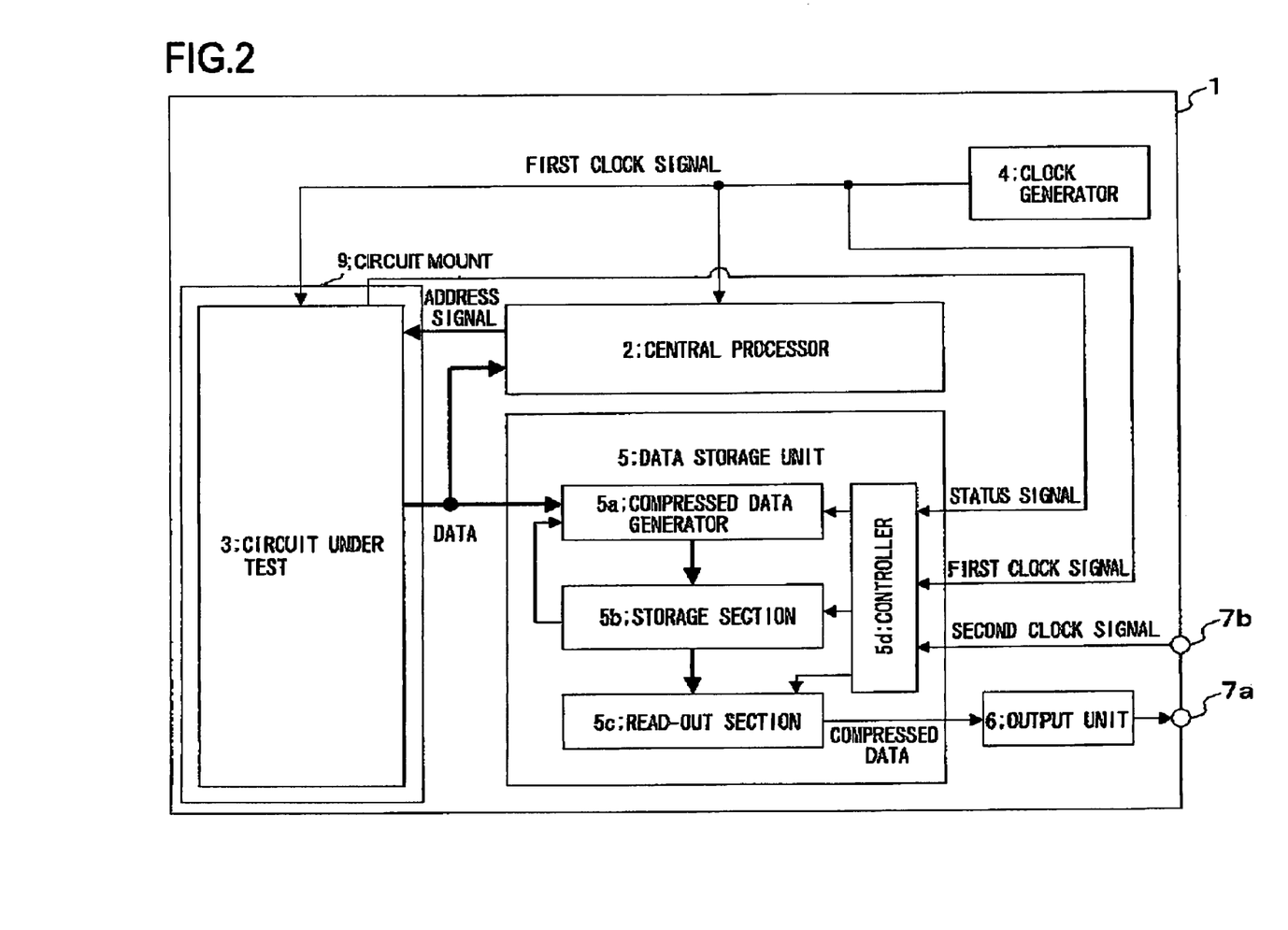
FIG. 2 is a block diagram schematically illustrating a first modification of the structure of a semiconductor integrated circuit according to the first embodiment of the present invention.
Figure 3:
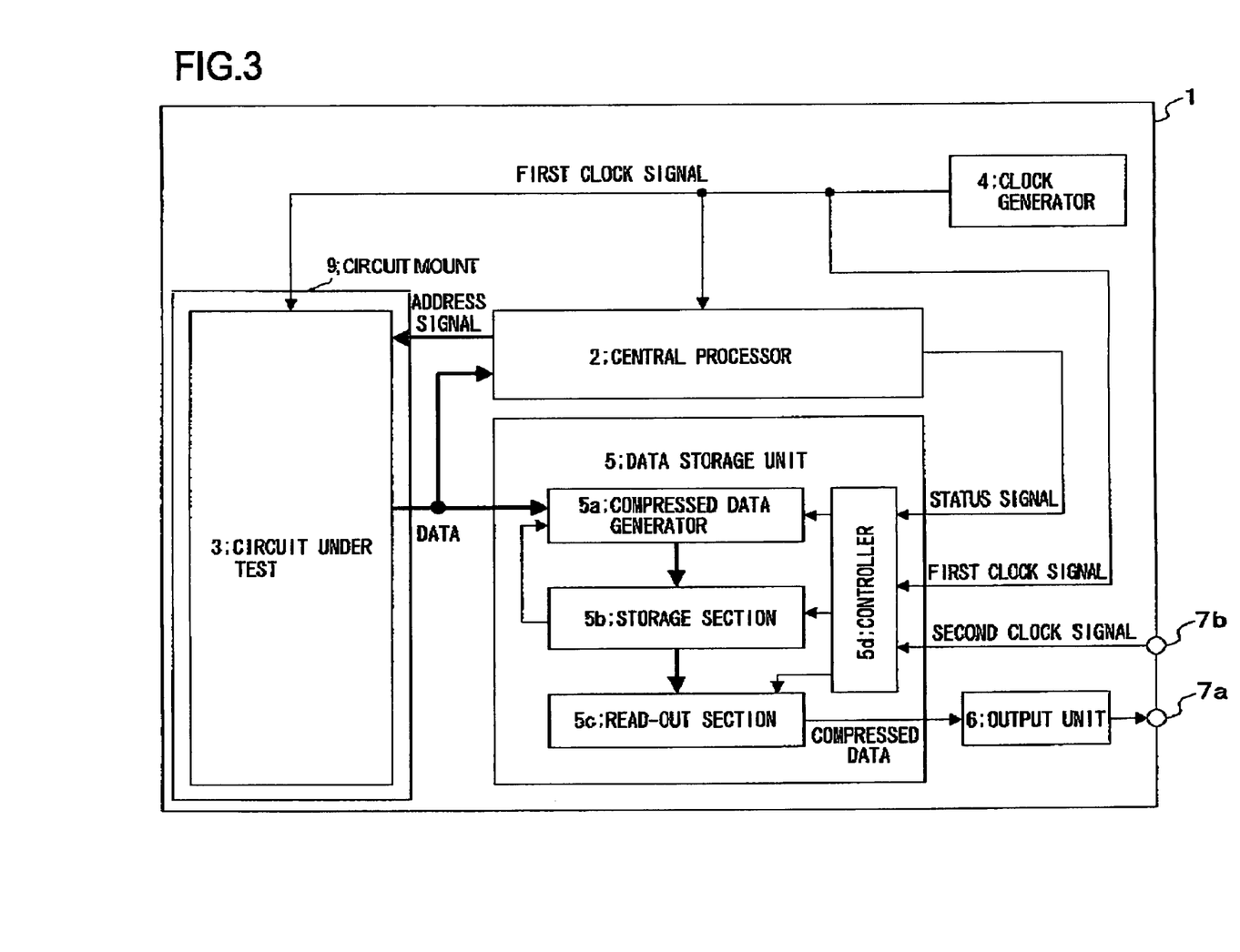
FIG. 3 is a block diagram schematically illustrating a second modification of the structure of a semiconductor integrated circuit according to the first embodiment of the present invention.
Figure 4:
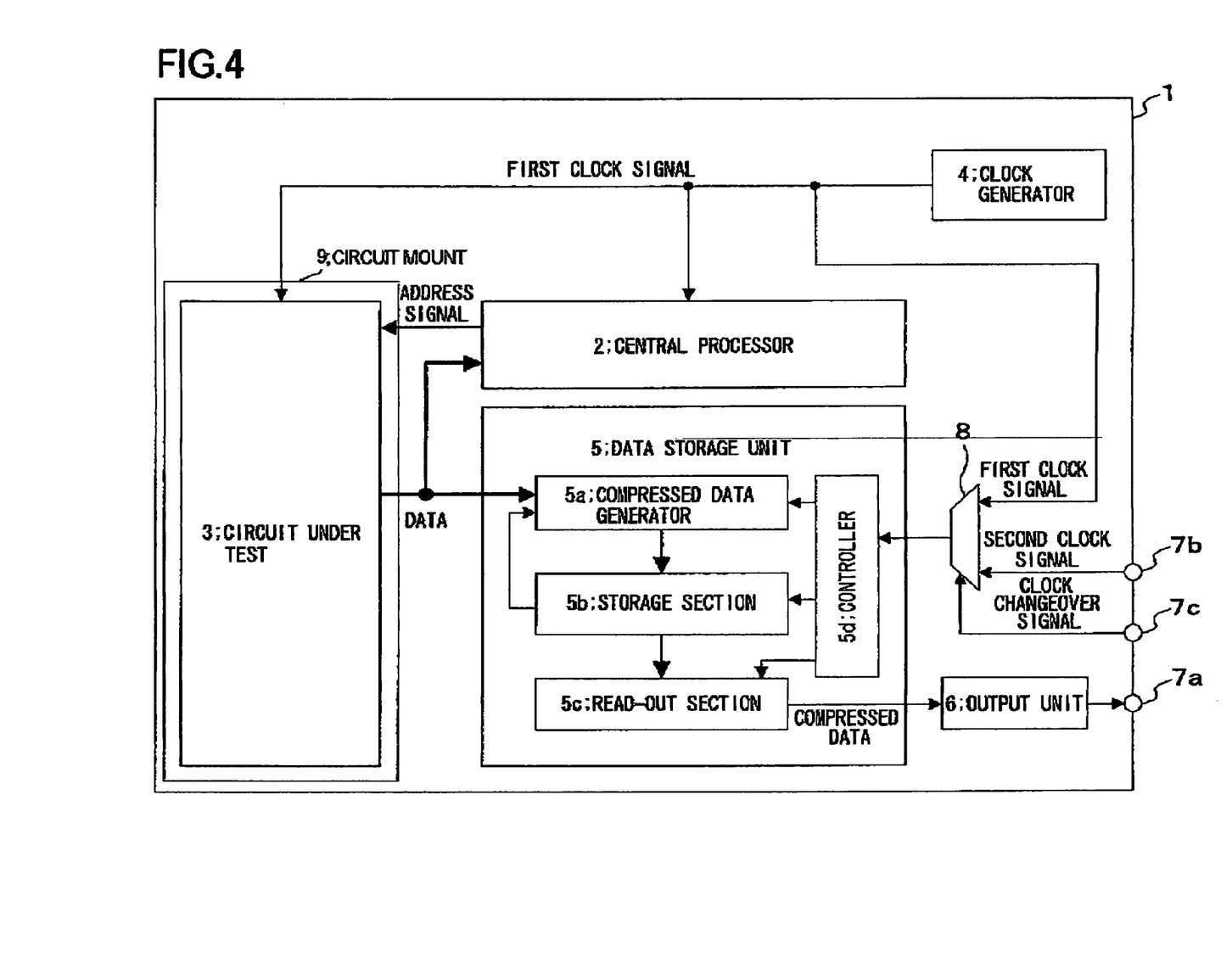
FIG. 4 is a block diagram schematically illustrating a third modification of the structure of a semiconductor integrated circuit according to the first embodiment of the present invention.

A semiconductor integrated circuit according to a first embodiment of the present invention will now be described with reference to the drawings, in which FIG. 1 is a block diagram schematically illustrating the structure of a semiconductor integrated circuit according to the first embodiment of the present invention, and FIGS. 2 to 4 are block diagram schematically illustrating modifications of the structure of the semiconductor integrated circuit according to the first embodiment of the present invention.

As shown in FIG. 1, a semiconductor integrated circuit 1 according to the present invention includes a central processor 2, a circuit 3 under test, a clock generator 4, a data storage unit 5, an output unit 6, a data output terminal 7a, a clock input terminal 7b and a clock change-over signal input terminal 7c.

The central processor 2, examples of which are a CPU and an MPU, processes information within the circuit 3 under test. When a test mode is in effect, the central processor 2 outputs an address signal (in parallel) to the circuit 3 under test in sync with a first clock signal from the clock generator 4. In the test mode, data corresponding to the address section enters the central processor 2 from the circuit 3 under test. The first clock signal is a signal generated by the clock generator 4. This is a clock signal having a frequency higher than that of a second clock signal.

The circuit 3 under test is a circuit to be tested by an LSI tester (not shown), and examples of the circuit are a ROM and a RAM, etc. The circuit 3 under test stores data on a per-address basis. In response to input of the first clock signal from the clock generator 4, the circuit 3 under test reads out the data of the corresponding address in sync with the first clock signal from the clock generator 4 and outputs the read data in parallel to the central processor 2 and data storage unit 5 (to the compressed data generator 5a of the data storage unit 5).

The clock generator 4, an example of which is a PLL circuit, generates the first clock signal. As shown in FIG. 1, the first clock signal is input to the central processor 2, circuit 3 under test and data storage unit 5 (the controller 5d of the data storage unit 5).

The data storage unit 5, an example of which is a MISR, compresses data from the circuit 3 under test and stores the compressed data. As shown in FIG. 1, the data storage unit 5 includes a compressed data generator 5a, a storage section 5b, a read-out section 5c and a controller 5d.

The compressed data generator 5a generates compressed data obtained by compressing the data from the circuit 3 under test. The compressed data generator 5a, which is supplied with the first clock signal from the controller 5d from start to end of read-out of the data from the circuit 3 under test, generates compressed data in sync with the first clock signal. It should be noted that the second clock signal is not supplied to the compressed data generator 5a from the controller 5d.

The compressed data generator 5a associates second compressed data, which is obtained, e.g., by compressing the data that has been output in parallel from the circuit 3 under test, with the first compressed data that has been output serially from the storage section 5b, and outputs the associated data (i.e., first and second compressed data) to the storage section 5b.

The storage section 5b temporarily stores the compressed data generated by the compressed data generator 5a. The storage section 5b is supplied with the first clock signal from the controller 5d from start to end of read-out of data from the circuit 3 under test, and temporarily stores compressed data in sync with the first clock signal during the storing operation. The storage section 5b is supplied with the second clock signal from the controller 5d from start to end of read-out of compressed data from the storage section 5b, and outputs the stored compressed data in parallel in sync with the second clock signal at this read-out time. The second clock signal is one that has entered from the clock input terminal 7b and has a frequency lower than that of the first clock signal.

The read-out section 5c reads the compressed data out of the storage section 5b. The read-out section 5c is supplied with the second clock signal from the controller 5d from start to end of read-out of the compressed data from the storage section 5b, reads compressed data out of the storage section 5b in parallel in sync with the second clock signal and outputs the read-out compressed data to the output unit 6 serially. It should be noted that the first clock signal is not supplied to the read-out section 5c from the controller 5d.

The controller 5d controls the operation of the compressed data generator 5a, storage section 5b and read-out section 5c. The inputs to the controller 5d are the first clock signal from the clock generator 4, the second clock signal from the clock input terminal 7b and the clock change-over signal from the clock change-over signal input terminal 7c. The controller 5d has a function of changing over the output clock signal from the first clock signal to the second clock signal when the clock change-over signal is input thereto. It should be noted that the function in the controller 5d, of changing over from the first clock signal to the second clock signal may be separated from the controller 5d it self and provided external to the data storage unit 5 (see a clock signal change-over unit 8 shown in FIG. 4). The controller 5d exercises control so as to supply the first clock signal to the compressed data generator 5a and storage section 5b from start to end of read-out of data from the circuit 3 under test, and supply the second clock signal to the storage section 5b and read-out section 5c from start to end of read-out of compressed data from the storage section 5b.

The clock change-over signal is a signal for changing over the clock signal, which is output by the controller 5d, from the first clock signal to the second clock signal. It should be noted that the clock change-over signal is not limited to one that is input from the clock change-over signal input terminal 7c. For example, use may be made of a status signal (see FIG. 2) that is output from the circuit 3 under test when read-out of data from the circuit 3 under test ends, or a status signal (see FIG. 3) that is output from the central processor 2 when output of the address signal ends.

The output unit 6 outputs the compressed data, which has been output serially from the data storage unit 5 (the read-out section 5c of the data storage unit 5), to the data output terminal 7a while buffering a difference in electrical characteristics between the data storage unit 5 and external circuitry (e.g., the LSI tester). An example of the output unit 6 is an input/output buffer (IO Buffer).

The data output terminal 7a is a terminal for outputting compressed data, which has been output from the output unit 6, to a point external to the semiconductor integrated circuit 1. The data output terminal 7a is electrically connected to the LSI tester (not shown).

The clock input terminal 7b is a terminal for inputting the second clock signal to the data storage unit 5 (to the controller 5d of the data storage unit 5). The clock input terminal 7b is electrically connected to the LSI tester (not shown).

The clock change-over signal input terminal 7c is a terminal for inputting the clock change-over signal to the data storage unit 5 (to the controller 5d of the data storage unit 5). The clock change-over signal input terminal 7c is electrically connected to the LSI tester (not shown). It should be noted that the clock change-over signal input terminal 7c need not be provided (see FIGS. 2 and 3) in a case where a status signal is output as the clock change-over signal from the central processor 2 or circuit 3 under test, etc. In a further modified mode according to FIG. 4, a change-over unit 8 is provided before the controller 5d. The change-over unit 8 receives the first and second clock signals and changes-over there between (i.e., from the first to the second clock signal, vice versa based on the clock change-over signal supplied via the clock change-over signal input terminal 7c.

Figure 5:
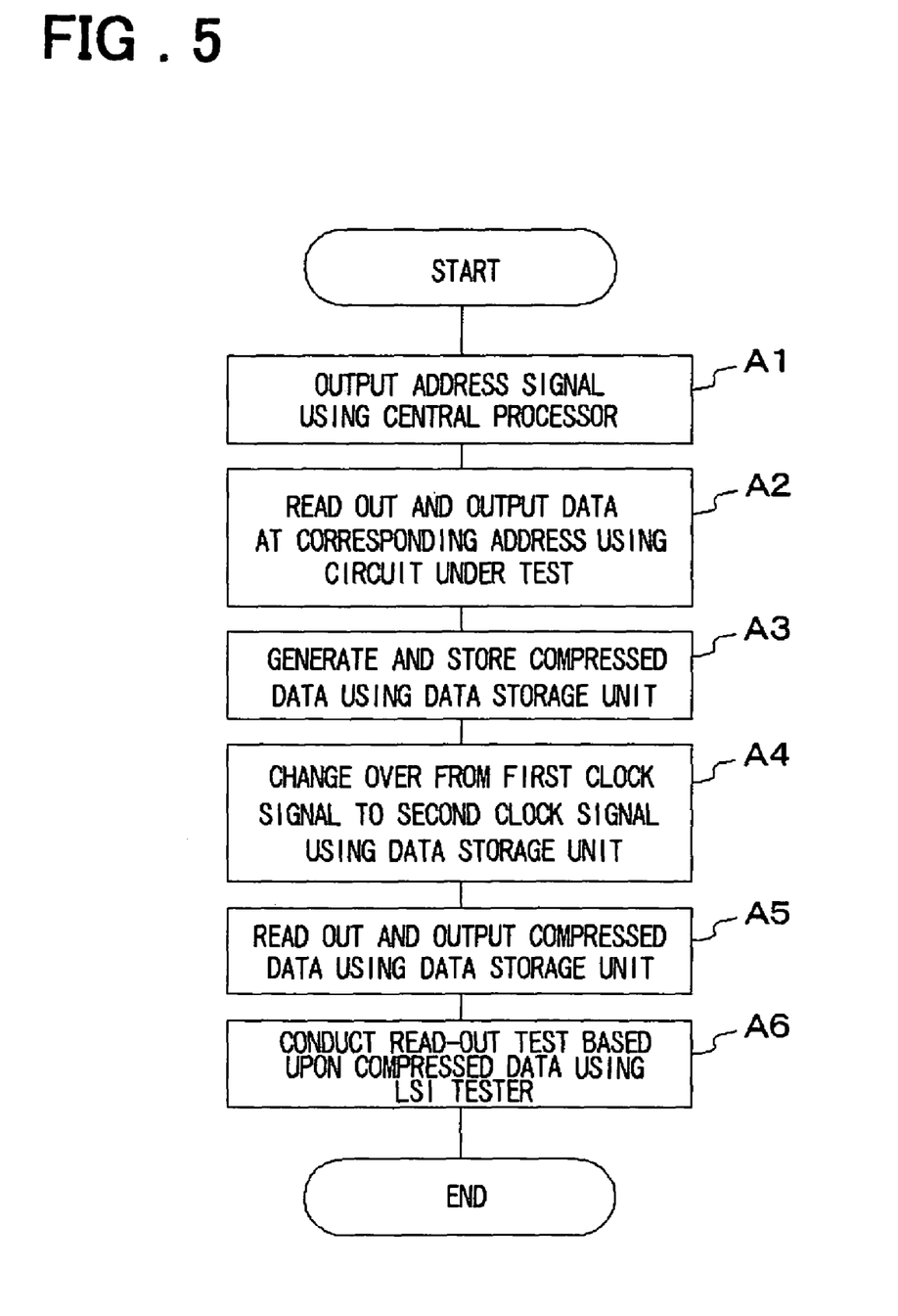
FIG. 5 is a flowchart schematically illustrating operation when the semiconductor integrated circuit of this embodiment is in a test mode.

Next, reference will be had to the drawings to describe operation when the semiconductor integrated circuit according to this mode of the present invention is in the test mode (operation in a case where a read-out test is performed on the circuit 3 under test mounted on the semiconductor integrated circuit 1). FIG. 5 is a flowchart schematically illustrating operation when the semiconductor integrated circuit is in the test mode. Reference should be had to FIG. 1 with regard to the various components constructing the semiconductor integrated circuit 1.

First, when the semiconductor integrated circuit is in the test mode, the central processor 2, circuit 3 under test and data storage unit 5 operate in sync with the first clock signal (a high-speed clock) supplied from the clock generator 4, and the central processor 2 outputs an address signal (in parallel) (step A1). Next, on the basis of the address signal from the central processor 2, the circuit 3 under test reads out data at the corresponding address in sync with the first clock signal (high-speed clock) and outputs the data in parallel (step A2). Next, the data storage unit 5 generates compressed data based upon data from the circuit 3 under test and stores the compressed data (step A3).

When read-out of data at all addresses of the circuit 3 under test ends and storage of all of the compressed data ends, the data storage unit 5 changes-over from the first clock signal to the second clock signal (a low-speed clock signal) in response to input of the clock change-over signal (step A4). Next, the data storage unit 5 reads out the stored compressed data in sync with the second clock signal (low speed) and outputs the compressed data in parallel (step A5).

The compressed data that has been output from the data storage unit 5 is then supplied to the LSI tester (not shown) via the output unit 6, and a read-out test is conducted by the LSI tester (step A6).

In accordance with the first embodiment of the present invention, a test can be performed using a low-speed LSI tester. The reason is that in an actual test, the read-out of data from the circuit 3 under test can be performed at a high speed using the first clock signal from the clock generator 4 and the comparison of the output compressed data with an expected value can be performed at low speed using the second clock signal. As a result, the cost of manufacture can be reduced while test reliability is maintained.

EMBODIMENT

Figure 6:
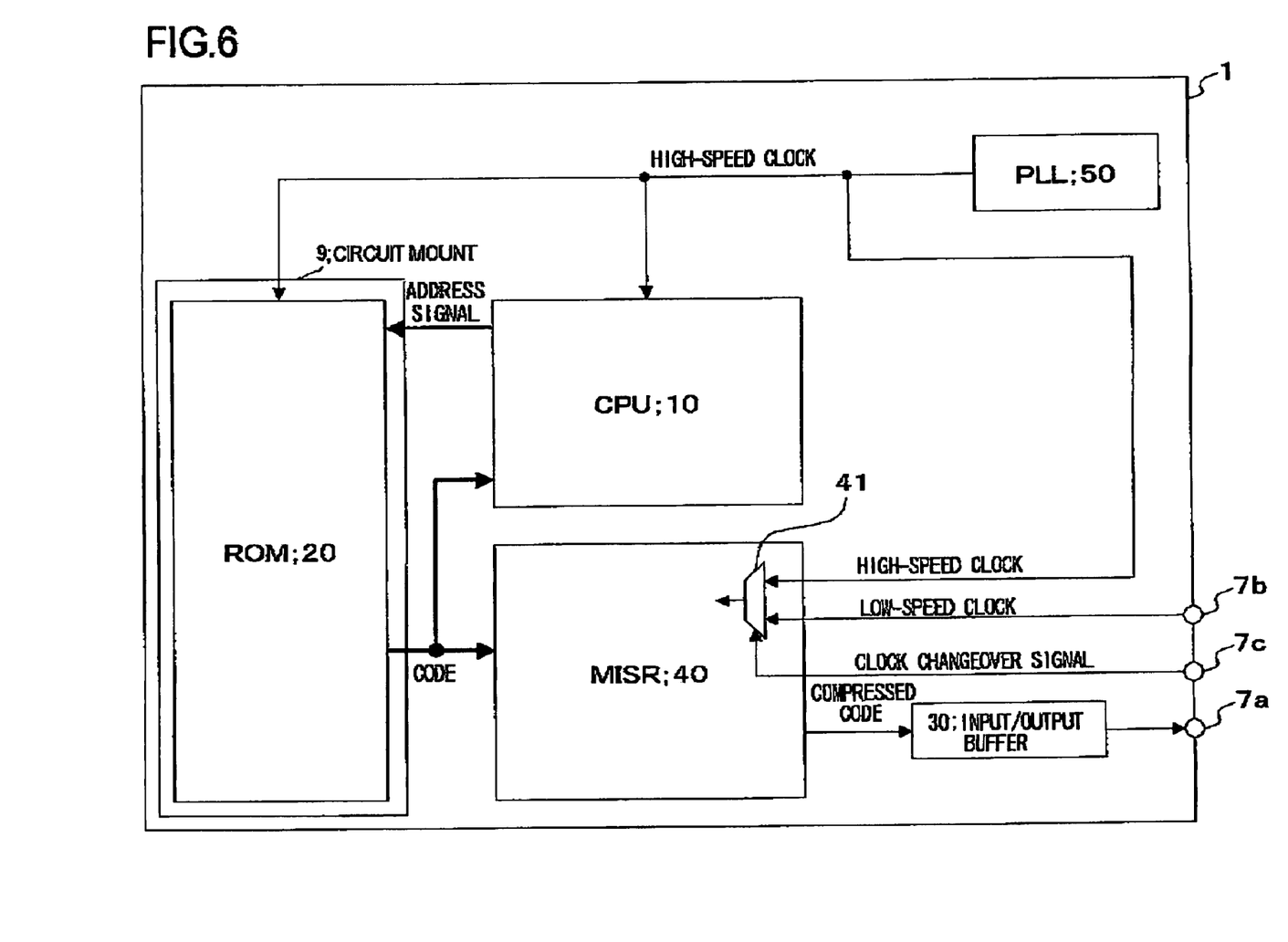
FIG. 6 is a block diagram schematically illustrating the structure of a semiconductor integrated circuit according to a second embodiment of the present invention.

A semiconductor integrated circuit according to a first embodiment of the present invention will now be described with reference to the drawings, whereas FIG. 6 is a block diagram schematically illustrating the structure of a semiconductor integrated circuit according to a second embodiment of the present invention.

In the semiconductor integrated circuit 1 according to the second embodiment, a CPU 10, a ROM 20, a PLL 50, an MISR 40 and an input/output unit 30 are employed as the central processor 2 (FIG. 1), circuit 3 (FIG. 1) under test, clock generator 4 (FIG. 1), data storage unit 5 (FIG. 1) and output unit 6 in (FIG. 1), respectively. The MISR 40 has a clock change-over unit 41. The clock change-over unit 41 corresponds to the clock signal change-over section of the controller 5d (FIG. 1) in the above-described first embodiment of the invention. When the clock change-over signal is input thereto, the clock change-over unit 41 changes-over the output clock signal from the high-speed clock to the low-speed clock. The functions of these units are similar to those of the first embodiment of the invention described above.

Operation in a case where the ROM 20 mounted on the semiconductor integrated circuit 1 of this embodiment is subjected to a read-out test will now be described. First, in the test mode, the CPU 10, ROM 20 and MISR 40 operate at the high-speed clock supplied from the PLL 50, an address signal is output from the CPU 10, code (e.g., 32 bits+7 bits of error-correction code) at the address corresponding to the address signal is output from the ROM 20, and compressed code (Signature, e.g., 39 bits) is generated by the MISR 40 based upon the above-mentioned code and is stored. When read-out of code at all addresses of the ROM 20 ends, the MISR 40 halts the generation of compressed data. If the clock change-over signal is input to the MISR 40 under these conditions, a change-over is made from the high-speed clock to the low-speed clock and the MISR 40 reads out the stored compressed data and outputs it serially in sync with the low-speed clock. The compressed code that has been output from the MISR 40 is thenceforth supplied to the LSI tester (not shown) via the input/output unit 30, and a read-out test is conducted by the LSI tester. The probability that error will be overlooked is about $1/32^{39}$ in case of data having a bit length of 39 bits. This is a very low probability and hence there is no problem in terms of a decline in reliability. In accordance with this embodiment, it is possible to conduct a test using a low-speed LSI tester, and cost of manufacture can be reduced while test reliability is maintained.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit test circuit for testing a circuit which outputs data in sync with a first clock signal, the test circuit comprising:
   a clock generator for generating the first clock signal; and
   a data storage unit that inputs and compresses the data output from said circuit to be tested in sync with said first clock signal, stores the compressed data, and outputs the stored data in sync with a second clock signal,
   wherein said second clock signal has a frequency less than a frequency of the first clock signal,
   wherein said data storage unit comprises a multiple-input feedback shift register (MISR),
   wherein said multiple-input feedback shift register comprises a clock change-over unit that changes-over between the first clock signal and the second clock signal, and
   wherein said changing-over between the first clock signal and the second clock signal is performed based on a clock change-over signal, which comprises a signal output from an external tester.

2. A semiconductor integrated circuit test circuit for testing a circuit which outputs data in sync with a first clock signal, the test circuit comprising:
   a clock generator for generating the first clock signal;
   a data storage unit that inputs and compresses the data output from said circuit to be tested in sync with said first clock signal, stores the compressed data, and outputs the stored data in sync with a second clock signal; and
   a central processing unit (CPU),
   wherein said second clock signal has a frequency less than a frequency of the first clock signal,
   wherein said data storage unit comprises a multiple-input feedback shift register (MISR),
   wherein said multiple-input feedback shift register comprises a clock change-over unit that changes-over between the first clack signal and the second clock signal,
   wherein said outputting of data from said circuit to be tested in sync with the first clock signal is performed by a read-out processing of said CPU, and
   wherein said clock changing-over between the first and second clock signals is performed based on a clock change-over signal which comprises a signal output from said circuit to be tested when said data reading-out from said circuit to be tested ends.

3. A semiconductor integrated circuit test circuit for testing a circuit which outputs data in sync with a first clock signal, the test circuit comprising:
   a clock generator for generating the first clock signal; and
   a data storage unit that inputs and compresses the data output from said circuit to be tested in sync with said first clock signal, stores the compressed data, outputs the stored data in sync with a second clock signal.
   wherein said second clock signal has a frequency less than a frequency of the first clock signal,
   wherein said data storage unit comprises a controller that controls the changing-over between the first clock signal and the second clock signal, and
   wherein said controller selects the first clock signal, when data is input to said data storage unit, and selects the second clock signal when data is output from said data storage unit.

4. The test circuit as defined in claim 3, wherein said data storage unit comprises:
   a compressed data generator that compresses data output from said circuit to be tested;
   a storage section that stores data output from said compressed data generator; and
   a read-out section that reads out data stored in said storage section,
   wherein the first clock signal is supplied to said compressed data generator,
   wherein the first and second clock signals being are supplied to said storage section, and
   wherein the second clock signal is supplied to said read-out section.

5. The test circuit as defined in claim 4, wherein said storage section outputs stored data to said compressed data generator, and
   wherein said compressed data generator compresses data output from said circuit to be tested, associates the compressed data with the stored data, and outputs the associated data to said storage section.

6. The test circuit as defined in claim 3, wherein the second clock signal comprises a signal output from a tester.

7. The test circuit as defined in claim 3, wherein said circuit to be tested comprises a read-only memory (ROM).

8. A semiconductor integrated circuit test circuit for testing a circuit which outputs data in sync with a first clock signet the test circuit comprising:
   a clock generator for generating the first clock signal;
   a data storage unit that inputs and compresses the data output from said circuit to be tested in sync with said first clock signal, stores the compressed data, outputs the stored data in sync with a second clock signal; and
   a central processing unit (CPU),
   wherein said second clock signal has a frequency less than a frequency of the first clock signal, and
   wherein said data storage unit changes-over between said first clock signal and said second clock signal based on a change-over signal outputted from the CPU.

* * * * *